(12) United States Patent
Pandey

(10) Patent No.: US 10,367,545 B2
(45) Date of Patent: Jul. 30, 2019

(54) ADAPTIVE FILTER WITH MANAGEABLE RESOURCE SHARING

(71) Applicant: NXP B.V.

(72) Inventor: Sujan Pandey, Waalre (NL)

(73) Assignee: NXP B.V., Eindhoven (NL)

( * ) Notice: Subject to any disclaimer, the term of this patent is extended or adjusted under 35 U.S.C. 154(b) by 9 days.

(21) Appl. No.: 15/700,528

(22) Filed: Sep. 11, 2017

(65) Prior Publication Data

US 2018/0145725 A1    May 24, 2018

(30) Foreign Application Priority Data

Nov. 18, 2016    (EP) ..................................... 16199542

(51) Int. Cl.
*H04B 3/23*    (2006.01)
*G06F 9/38*    (2018.01)
*H03H 21/00*    (2006.01)

(52) U.S. Cl.
CPC ........... *H04B 3/232* (2013.01); *G06F 9/3891* (2013.01); *H03H 21/0012* (2013.01); *H04B 3/234* (2013.01); *H04B 3/235* (2013.01); *H03H 2218/08* (2013.01)

(58) Field of Classification Search
USPC ..................... 379/406.08, 406.01, 406.09
See application file for complete search history.

(56) References Cited

U.S. PATENT DOCUMENTS

| 4,985,900 | A | * | 1/1991 | Rhind | ..................... H04L 1/206 315/118 |
| 5,309,481 | A | * | 5/1994 | Viviano | .............. H04L 27/3872 375/232 |
| 5,777,910 | A | | 7/1998 | Lu | |
| 5,809,058 | A | * | 9/1998 | Sato | ..................... H04B 1/7097 370/291 |
| 5,946,351 | A | * | 8/1999 | Ariyavisitakul | .. H04L 25/03057 375/233 |
| 6,108,681 | A | * | 8/2000 | Wittig | ................ H03H 17/0225 708/319 |

(Continued)

OTHER PUBLICATIONS

Apolinario et al. "QRD-RLS Adaptive Filtering, Chapter 2: Introduction to Adaptive Filters", Springer Publishing Company, pp. 23-49 (Jan. 2009).

(Continued)

*Primary Examiner* — Akelaw Teshale
(74) *Attorney, Agent, or Firm* — Rajeev Madnawat

(57) ABSTRACT

The present application relates to an adaptive filter using manageable resource sharing and a method of operating the adaptive filter. The adaptive filter comprises a cluster controller configured for allocating each of several computational blocks to one of several clusters and a routing controller for configuring the routing of tapped delay signals by a routing logic to the respective cluster in accordance with an allocation of the tapped delay signals to the clusters. Each of computational blocks is configured for adjusting one filter coefficient, $c_i(n)$, in one cycle of an iterative procedure according to an adaptive convergence algorithm. The number of computational blocks is less than an order of the adaptive filter.

14 Claims, 12 Drawing Sheets

(56) References Cited

U.S. PATENT DOCUMENTS

| | | | |
|---|---|---|---|
| 7,120,656 B1* | 10/2006 | Lam | H03H 17/0009 |
| | | | 708/319 |
| 7,499,513 B1 | 3/2009 | Tetzlaff et al. | |
| 9,001,883 B2 | 4/2015 | Tsai et al. | |
| 2002/0150155 A1* | 10/2002 | Florentin | H03H 21/0012 |
| | | | 375/233 |
| 2005/0031045 A1* | 2/2005 | Mayor | H04B 1/7115 |
| | | | 375/260 |
| 2008/0013657 A1* | 1/2008 | Aouine | H03H 17/0294 |
| | | | 375/350 |
| 2009/0198754 A1* | 8/2009 | Chang | H03H 17/0294 |
| | | | 708/319 |
| 2012/0071107 A1* | 3/2012 | Falck | H01Q 3/24 |
| | | | 455/67.12 |
| 2013/0170538 A1* | 7/2013 | Ki | H04B 1/711 |
| | | | 375/231 |
| 2014/0140416 A1 | 5/2014 | Yamazaki et al. | |
| 2014/0241181 A1 | 8/2014 | Barrass et al. | |
| 2014/0348276 A1* | 11/2014 | Pandey | H04B 1/1027 |
| | | | 375/350 |
| 2018/0141363 A1 | 5/2018 | Pandey | |

OTHER PUBLICATIONS

Non-Final Office Action dated Jan. 4, 2019 for U.S. Appl. No. 15/702,572 11 pgs.

Notice of Allowance for related U.S. Appl. No. 15/702,572 8 pgs. (dated Apr. 25, 2019).

* cited by examiner

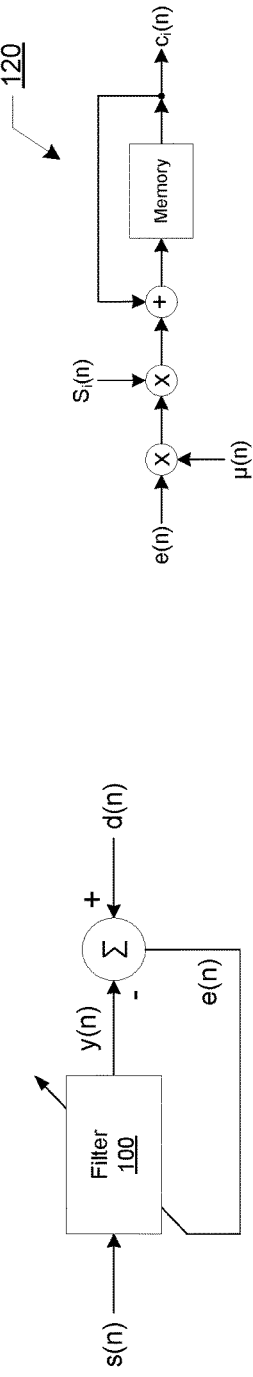
FIG. 1
FIG. 3
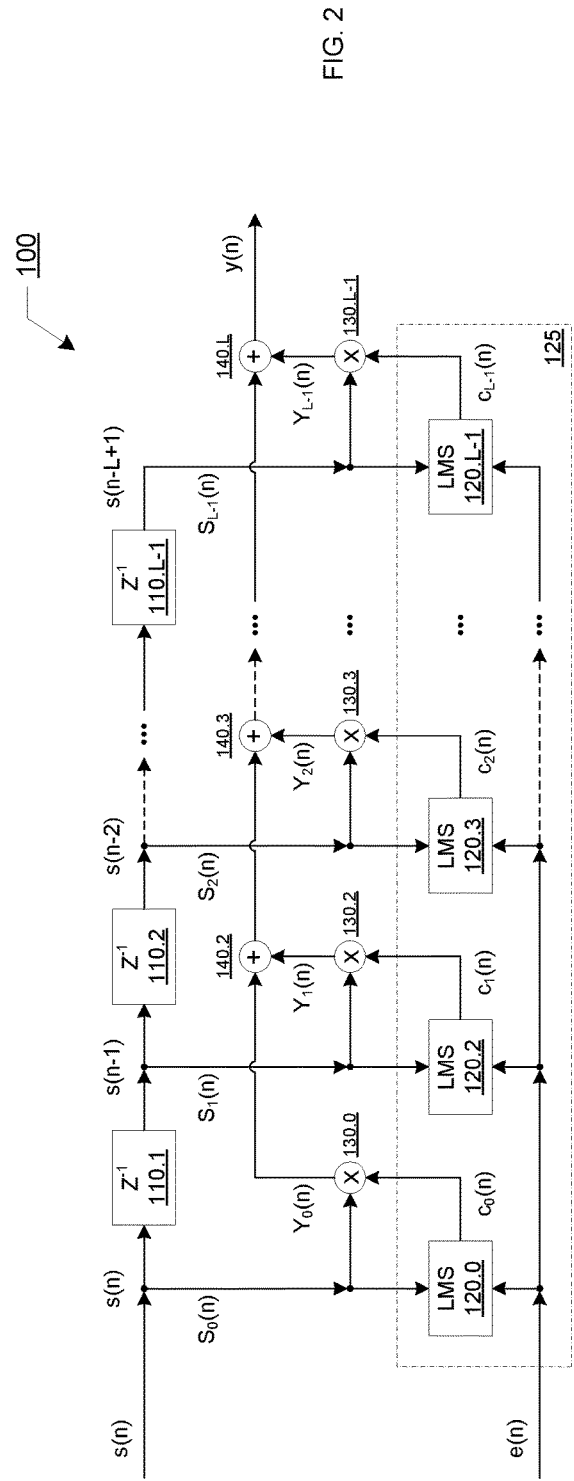
FIG. 2

ADAPTIVE FILTER WITH MANAGEABLE RESOURCE SHARING

CROSS-REFERENCE TO RELATED APPLICATIONS

This application claims the priority under 35 U.S.C. § 119 of European Patent application no. 16199542.8, filed on Nov. 18, 2016, the contents of which are incorporated by reference herein.

FIELD OF THE INVENTION

The present disclosure relates generally to an adaptive filter. In particular, the present disclosure relates to an adaptive filter using resource sharing of computational blocks for performing filter coefficient convergence algorithm. More particularly, the present disclosure relates to a manageable sharing of computational block resources for an adaptive filter.

BACKGROUND

An adaptive filter is a computational device that attempts to model the relationship between two signals in real time in an iterative manner.

Such adaptive filters are used in many applications e.g. for canceling undesired signal components. Echo cancelers/equalizer (for inter-symbol interference cancellation) are a typical application of the adaptive filter for canceling an echo resulting from the trans-hybrid coupling of a hybrid circuit with an echo replica derived from the input signal of the adaptive filter. Adaptive filters are often realized either as a set of program instructions running on an arithmetical processing device such as a microprocessor or DSP chip, or as a set of logic operations implemented in a field-programmable gate array (FPGA) or in a semicustom or custom VLSI integrated circuit.

The adaptive filter has a tapped-delay line and a tap-weight coefficient controller for producing a sum of tap signals weighted respectively by tap-weight coefficients. According to a known adaptive convergence algorithm such as the LMS (least mean square) algorithm, the tap-weight (filter) coefficients are updated by correlations between the tap signals and a residual error of a correction signal, which is represented by the sum of the weighted tap signals.

A preferably optimal use of the computational resources of the adaptive filter for performing the adaptive convergence algorithm is a major desire in view of power efficient implementation for a cost sensitive market.

SUMMARY

The present invention provides an adaptive filter with manageable resource sharing and a method of operating adaptive filter with manageable resource sharing as described in the accompanying claims. Specific embodiments of the invention are set forth in the dependent claims. These and other aspects of the invention will be apparent from and elucidated with reference to the embodiments described hereinafter.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

FIG. 1 schematically illustrates a block diagram of a general adaptive filter according to an example of the present invention;

FIG. 2 schematically illustrates a block diagram of an exemplary adaptive filter according to an example of the present invention;

FIG. 3 schematically illustrates a block diagram of a computational module for adjusting a filter coefficient of an adaptive filter according to an example of the present invention.

DETAILED DESCRIPTION

Figure 4:
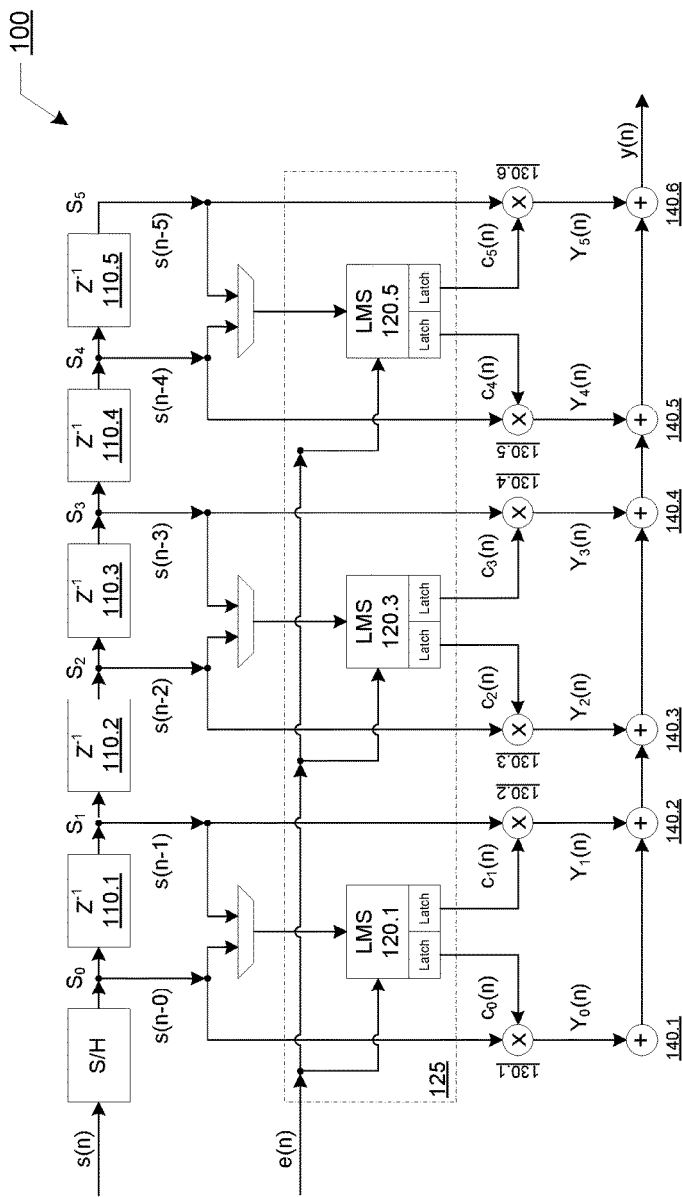
FIG. 4 schematically illustrates a block diagram of an exemplary adaptive filter using computational resources sharing according to an example of the present invention.

Embodiments of the present disclosure will be described below in detail with reference to drawings. Note that the same reference numerals are used to represent identical or equivalent elements in figures, and the description thereof will not be repeated. The embodiments set forth below represent the necessary information to enable those skilled in the art to practice the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Referring now to FIG. 1, a block diagram of a general adaptive filter is schematically illustrated. A digital input signal s(n) is fed into the adaptive filter 100, which is arranged to compute a digital output signal y(n) at each time n. The digital output signal y(n) is a function of the digital input signal s(n) and a set of parameters including so-called filter coefficients $c_i(n)$. The digital output signal y(n) is compared to a response or reference signal d(n) by subtracting the digital output signal y(n) and the reference signal d(n) at each time n. The difference signal e(n)=d(n)−y(n) is called error signal e(n), which is fed into a component, which is arranged to adapt the filter coefficients $c_i(n)$ in accordance with an adaptive filter coefficient convergence algorithm. The adaptive convergence algorithm adapts the filter coefficients $c_i(n)$ from time n to newly adapted filter coefficients $c_i(n+1)$ at time (n+1), where i=0, . . . , L−1. The objective of the adaptive convergence algorithm is to minimize a cost function based on the error signal e(n). The parameters within the adaptive filter 100 may depend on its design and computational implementation.

Referring now to FIG. 2, a block diagram of an exemplary adaptive filter according to an embodiment of the present application is schematically illustrated. The exemplary adaptive filter 100 comprises a finite number L of filter coefficients $c_0$ to $c_{L-1}$. A coefficient vector can be written as $C(n)=[c_0(n), c_1(n), \ldots, c_{L-1}(n)]^T$.

Assuming a linear relationship between input signal s(n) and output signal y(n), the adaptive filter can take the form of a finite-impulse-response (FIR) filter as exemplified in herein with reference to FIG. 2. A finite-impulse-response (FIR) filter comprises a tapped-delay-line with L−1 delay elements 110.1 to 110.L−1 denoted "$Z^{-1}$" module and each filter coefficient is a multiplicative gain. The output signal y(n) can be written as $$y(n) = \sum_{i=0}^{L-1} c_i(n)s(n-i) = \sum_{i=0}^{L-1} Y_i(n) = C(n)S(n)$$

where $S(n)=[s(n), s(n-1), \ldots, s(n-L+1)]^T$ is the input signal vector.

As shown in FIG. 1, the adaptive filter comprises L multipliers 130.0 to 130.L−1 for multiplying each tapped delay signal s(n−i) with the respective filter coefficient $c_i(n)$, where i=0 to L−1, and L−1 adders 140.2 to 140.L for adding the weighted output signal contributions $Y_i(n)$. The adaptive filter further comprises at least 2L memory locations to store the L tapped delay signals s(n−1) and the L filter coefficients $c_i(n)$.

The adaptive convergence algorithm of an adaptive filter for adjusting the filter coefficients $c_i(n)$ is performed to minimize a cost function selected with respect to a respective use case of the adaptive filter. The adjusting of the filter coefficients $c_i(n)$ is performed in an iterative procedure:

$C(n+1)=C(n)+\mu(n)\cdot G(e(n), S(n), \Phi(n))$ where $G(e(n), S(n), \Phi(n))$ is a nonlinear vector function, $\mu(n)$ is the so-called step size, e(n) is the error signal and S(n) is the input signal vector. $\Phi(n)$ is a vector of states that may be used to describe pertinent information of the characteristics of the input signal, error signal and/or filter coefficients.

The adaptive filter comprises a coefficient-adjusting module 125, which performs the aforementioned adaptive convergence algorithm. At least the error signal e(n) and the input signal vector S(n) is input to the coefficient adjusting module 125, which may further comprise at least L memory storage locations to store the filter coefficients $c_i(n)$ and to supply the stored filter coefficients $c_i(n)$ for generating the output signal y(n). Further parameters required by the adaptive convergence algorithm implemented in the coefficient-adjusting module 125 such as the step size $\mu(n)$ may be predefined and/or configurable.

Least mean squares (LMS) functions are used in a class of adaptive filters to mimic a desired filter by finding the filter coefficients that relate to producing the least mean squares of the error signal e(n) (difference between the desired and the actual signal). It is a stochastic gradient descent methodology in that the filter coefficients are only adapted based on the error signal at a current time.

In particular, LMS algorithms are based on the steepest descent methodology to find filter coefficients, which may be summarized as following:

$C(n+1)=C(n)+\mu\cdot e(n)\cdot S(n)$ $c_i(n+1)=c_i(n)+\mu\cdot e(n)\cdot s(n-i)$ where $C(n)=[c_0(n), c_1(n), \ldots, c_{L-1}(n)]^T$, $S(n)=[s(n), s(n-1), \ldots, s(n-L+1)]^T$, $\mu$ is the step size and L is the order of the filter.

The filter coefficients are determined in an iterative procedure starting with initial values of the filter coefficients $C^{init}(n)=[c_0^{init}(n), c_1^{init}(n), \ldots, c_{L-1}^{init}(n)]^T$. The initial values are predefined. In a non-limiting example, the initial values of the filter coefficients $c_i^{init}(n)$ may be set to zero, i.e. $C^{init}(n)=[0,0,\ldots,0]^T=zeros(L)$, but non-zero initial values likewise. As the LMS algorithm does not use the exact values of the expectations, the filter coefficients would never reach the optimal convergence values in the absolute sense, but a convergence is possible in mean. Even though the filter coefficients may change by small amounts, they change about the convergence values. The value of step-size $\mu$ should be chosen properly. In the following, a filter coefficient changing by small amounts about its optimal convergence value, will be referred to as a filter coefficient, which has reached steady state.

A LMS computational block 120.0 to 120.L−1 may be arranged for each filter coefficient $c_i(n)$ of the adaptive filter shown in FIG. 2. Such a LMS computational block 120.0 to 120.L−1 comprises for instance two multipliers, an adder and a memory storage location as illustratively shown in form of a schematic block diagram in FIG. 3. It should be noted that the computational module of FIG. 3 is merely exemplary and not intended to limit the present application.

Referring now to FIG. 4, a block diagram of a further exemplary adaptive filter according to an embodiment of the present application is schematically illustrated. The adaptive filter shown in FIG. 4 makes use of fixed computational resource sharing in order to reduce the implementation complexity and costs. The exemplary adaptive filter of FIG. 4 will be explained to introduce to the technique of resource sharing, which is the basis of the concept of the present application. The computational resources used for performing the adjustment of the filter coefficients are shared among the filter coefficients $c_i(n)$ of the adaptive filter. Only a subset of the filter coefficients $c_i(n)$ is adjusted at a current time, e.g. at time n, the remaining subset of filter coefficients $c_i(n)$ are maintained and adjusted at a later point in time, e.g. at time n+1. Herein, n may be understood to designate the sampling index n further described below.

For the sake of illustration, the exemplary adaptive filter schematically shown in FIG. 4 is an adaptive filter with a filter order of L=6, which means that the tapped-delay-line has 5 delay elements 110.1 to 110.5 and provides six tapped delay signal $s(n-i)$, $i=0, \ldots, 5$, which are multiplied (weighted) with 6 filter coefficients $c_i(n)$. The exemplary adaptive filter further comprises the LMS computational blocks 120.1, 120.3 and 120.5, wherein each of the LMS computational blocks 120.1, 120.3 and 120.5 is provided for adjusting two different ones of the filter coefficients $c_i(n)$. The LMS computational block 120.1 is provided and configured to adjust the filter coefficients $c_0(n)$ and $c_1(n)$, the LMS computational block 120.3 is provided and configured to adjust the filter coefficients $c_2(n)$ and $c_3(n)$ and the LMS computational block 120.5 is provided and configured to adjust the filter coefficients $c_4(n)$ and $c_5(n)$. Each tapped delay signal $s(n-i)$ and the associated filter coefficient $c_i(n)$ is fixedly assigned to one of the computational blocks 120, which is fixedly shared with one or more further tapped delay signals $s(n-i)$ and the associated filter coefficients $c_i(n)$. Each computational block 120 is timely shared to perform the calculation for adjusting the two or more assigned filter coefficients $c_i(n)$ according to the implemented filter coefficient convergence algorithm.

Figure 5:
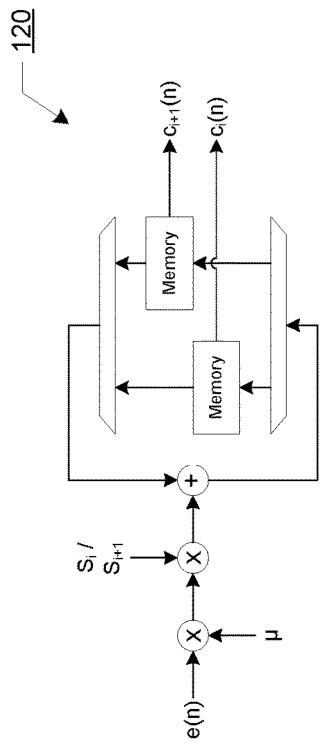
FIG. 5 schematically illustrates a block diagram of a computational module for adjusting filter coefficients of an adaptive filter with computational resources sharing according to an example of the present invention.

Referring now to FIG. 5, a LMS computational block such as each LMS computational blocks 120.1, 120.3 and 120.5 may comprises for instance two multipliers, an adder and two memory storage locations, which are selectively coupled to the adder, as illustratively shown in form of a schematic block diagram of FIG. 5. The calculation for adjusting one filter coefficient can be carried out at one cycle. Hence, each filter coefficient is updated each second cycle, which means that the convergence speed is halved in accordance with a respective sharing factor $k=2$.

Figure 6:
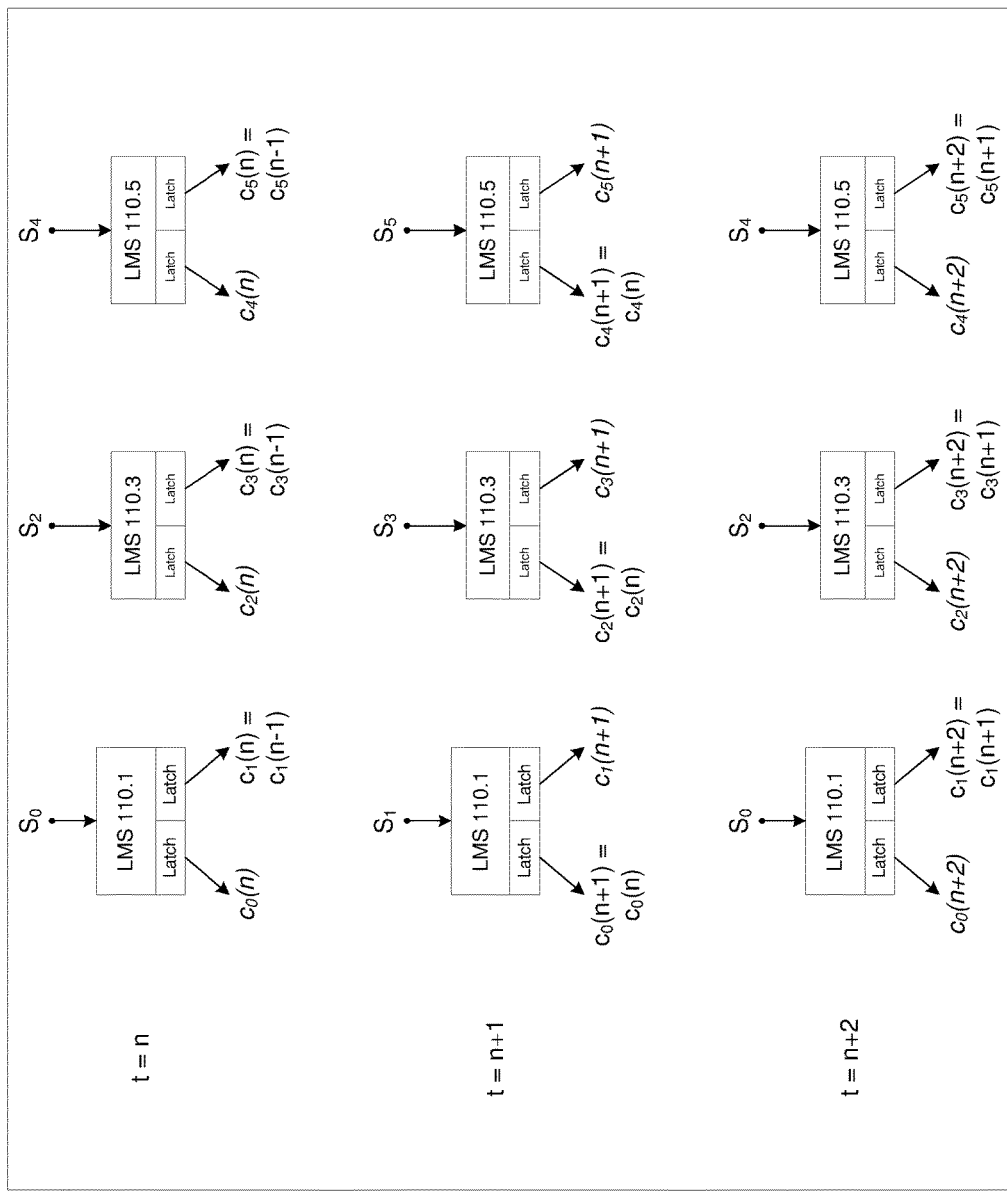
FIG. 6 schematically illustrates an adjusting procedure of the exemplary adaptive filter with computational resources sharing according to an example of the present invention.

With reference to FIG. 6, the adjusting procedure of the computational resources sharing exemplary adaptive filter of FIG. 4 is schematically illustrated. At time n, the tapped delay signal $s(n-i)$, $i=0, 2,$ and 4, are supplied to the respective ones of the LMS computational blocks 120.1, 120.3 and 120.5, at which the filter coefficients of a first subset $c_i(n)$, $i=0, 2,$ and 4, are adjusted. The second subset $c_i(n)$, $i=1, 3, 5$, comprising the remaining filter coefficients are maintained, e.g. $c_i(n)=c_i(n-1)$ for $i=1, 3, 5$. At time $n+1$, the tapped delay signal $s(n+1-i)$, $i=1, 3,$ and 5, are supplied to the respective ones of the LMS computational blocks 120.1, 120.3 and 120.5, at which the filter coefficients of the second subset $c_i(n)$, $i=1, 3,$ and 5, are adjusted. The filter coefficients of the first subset $c_i(n+1)$, $i=0, 2, 4$, are maintained, e.g. $c_i(n+1)=c_i(n)$ for $i=0, 2, 4$. At time $n+2$, the tapped delay signal $s(n+2-i)$, $i=0, 2,$ and 4, are supplied to the respective one of the LMS computational blocks 120.1, 120.3 and 120.5, at which the filter coefficients of the second subset $c_i(n+2)$, $i=0, 2,$ and 4, are adjusted. The filter coefficients of the first subset $c_i(n+2)$, $i=1, 3, 5$, are maintained, e.g. $c_i(n+2)=c_i(n+1)$ for $i=1, 3, 5$. The adjusting procedure is continued in the above described alternating manner for each next time step $n=n+1$.

This means that when using computational resources sharing each filter coefficient is updated each k-th iteration in time, herein $k=2$. In general, the computational resources sharing may be implemented with higher values of k, which will be denoted as sharing factor k in the following, wherein k is integer and $k>1$. The number of LMS computational blocks corresponds to the filter order $L=6$ divided by the sharing factor $k=2$: $L/k=3$. The exemplified adaptive filter comprises the three LMS computational blocks 120.1, 120.3 and 120.5.

Those skilled in the art understand that the above-described resource sharing scheme is only an illustrative scheme to improve the understanding of the concept of the present application but not intended to limit the present application.

The adjusting of filter coefficients in adaptive filter requires computational blocks configured to carry out the adaptive convergence algorithm. Each computational block is enabled to perform the adjusting procedure of one filter coefficient $c_i(n)$ at one cycle. Therefore, the number of computational blocks in traditional adaptive filters corresponds to the order L of the adaptive filter or the number of tapped delay signal $s(n-i)$ provided by the tapped-delay-line. In adaptive filters using computational resources sharing, the number of computational blocks is less than the order L of the adaptive filter. Accordingly, only a subset of the filter coefficients is adjusted in one cycle. In an example of the present application, the number of filter coefficients is an integer multiple of the number of filter coefficients in each subset. The integer multiple corresponds to the sharing factor k.

Figure 7:
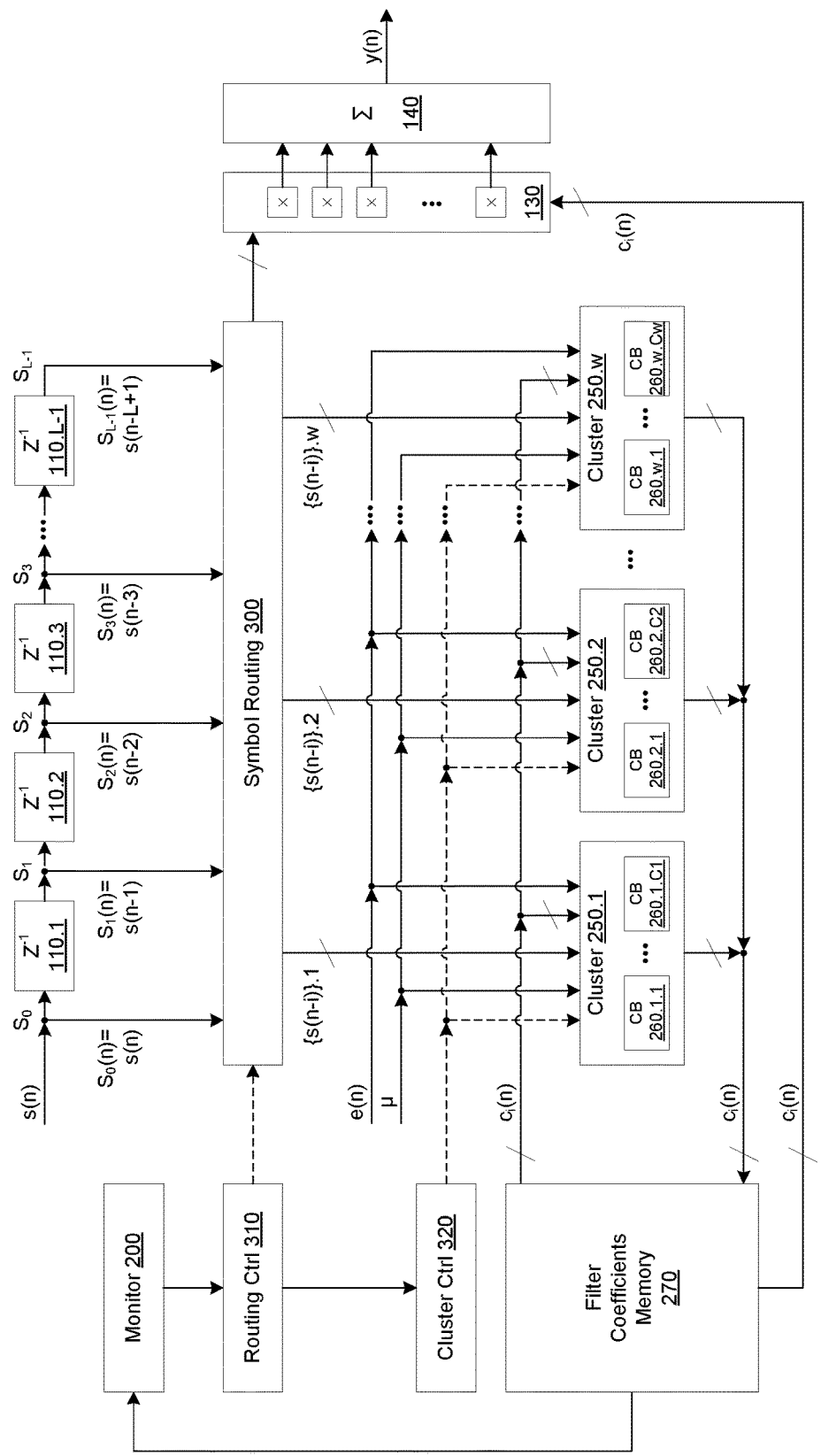
FIG. 7 schematically illustrates a block diagram of an exemplary adaptive filter using manageable computational resources sharing according to an example of the present invention.

Referring now to FIG. 7, a block diagram of a yet another exemplary adaptive filter according to an embodiment of the present application is schematically illustrated. The adaptive filter shown in FIG. 7 makes use of manageable computational resource sharing.

The exemplary adaptive filter comprises a number of computational blocks 260. In particular, the number of computational blocks 260 is determined at implementation or design stage. Each of the computational blocks 260 is enabled to perform the adjusting procedure of a filter coefficient $c_i(n)$ at one cycle. The adjusting procedure is carried out in accordance with an adaptive convergence algorithm. The computational blocks 260 are accordingly configured. The computational blocks 260 are not fixedly assigned to one or more tapped delay signals $s(n-i)$. A symbol routing logic 300 is provided in the adaptive filter, which is configurable to selectively route any tapped delay signals $s(n-i)$ to any computational block 260. Hence, each of the computational blocks 260 is freely assignable to one tapped delay signal $s(n-1)$ at one cycle.

For managing the computational blocks 260, each of the computational blocks 260 is allocated to one of a number of w clusters 250.$j$, wherein $j=1, \ldots, w$ and w is a positive non-zero integer. The number w of clusters is configurable. Each of the plurality of clusters 250.1 to 250.$w$ comprises an individual set of Cj computational blocks 260, wherein $j=1, \ldots, w$. The number of computational blocks 260.$j$ comprised in each cluster 250.1 to 250.$w$ may differ. For instance, the cluster 250.1 comprises a set of C1 computational blocks CB 260.1.1 to 260.1.C1, the cluster 250.2 comprises a set of C2 computational blocks CB 260.2.1 to 260.2.C2 and the cluster 250.$w$ comprises a set of Cw computational blocks CB 260.$w$.1 to 260.w.Cw.

The symbol routing logic 300 routes each one of a number of w sets of tapped delay signals $\{s(n-i)\}.1$ to $\{s(n-i)\}.w$ to a respective one of the clusters 250.1 to 250.$w$. Each set of tapped delay signals $\{s(n-i)\}$ comprises Mj tapped delay signals $s(n-i)$, wherein $j=1, \ldots, w$. The number of tapped delay signals $s(n-i)$ comprised by each set may differ. For instance, a first set $\{s(n-i)\}$ of tapped delay signals $s(n-i)$ is routed to the cluster 250.1 and comprises M1 tapped delay signals $s(n-i)$, a second set $\{s(n-i)\}$ of tapped delay signals $s(n-i)$ is routed to the cluster 250.2 and comprises M2 tapped delay signals $s(n-i)$, a w-th set $\{s(n-i)\}$ of tapped delay signals $s(n-i)$ is routed to the cluster 250.$w$ and comprises Mw tapped delay signals $s(n-i)$.

The number of sets of tapped delay signals $\{s(n-i)\}.1$ to $\{s(n-i)\}.w$ correspond to the number of clusters 250.1 to 250.w.

The filter coefficients $c_i(n)$ are stored in a coefficient memory storage 270, to which the computational blocks 260 have access to read a respective filter coefficient $c_i(n)$ from a respective memory location thereof and write an updated filter coefficient $c_i(n)$ to the respective memory location thereof.

The allocation of each computational block 260 to a respective one of the clusters 250.1 to 250.w and the operation of the computational blocks 260 is under control of a cluster controller block 320. The cluster controller block 320 is configured to turn on/off the computational blocks 260 individually and/or cluster-wise. The cluster controller block 320 is further arranged to configure the computational blocks 260 to enable access to the required filter coefficient $c_i(n)$ corresponding to the tapped delay signal $s(n-i)$ supplied thereto by the symbol routing logic 300.

The routing of the tapped delay signals $s(n-1)$ is under control of a routing controller block 310, which configures the symbol routing logic (300) accordingly. The routing controller block 310 is configured to allocate each tapped delay signal $s(n-i)$ to one of the sets of tapped delay signals $\{s(n-i)\}.1$ to $\{s(n-i)\}.w$. The routing controller block 310 configures the symbol routing logic 300 to route each set of tapped delay signals $\{s(n-i)\}.1$ to $\{s(n-i)\}.w$ to each respective one of the clusters 250.1 to 250.w. Each set of tapped delay signals $\{s(n-i)\}.1$ to $\{s(n-i)\}.w$ is assigned to one of the clusters 250.1 to 250.w. Each cluster 250.1 to 250.w receives the tapped delay signals $s(n-i)$ of one set of tapped delay signals $\{s(n-i)\}.1$ to $\{s(n-i)\}.w$.

The routing controller block 310 and the cluster controller block 320 receive information from a monitoring block 200, which has access to the coefficients memory 270 and which is arranged to monitor the development of the filter coefficients $c_i(n)$. The monitoring block 200 is enabled to supply information relating to the development of the filter coefficients $c_i(n)$ to the routing controller block 310 and the cluster controller block 320, which are arranged to dynamically operate the exemplified adaptive filer based on the received information.

The operation of the adaptive filter with controllable computational resource sharing according to an embodiment of the present application will be further explained with reference to FIGS. 8a and 8b, which show exemplary filter coefficient plots.

Figure 8A:
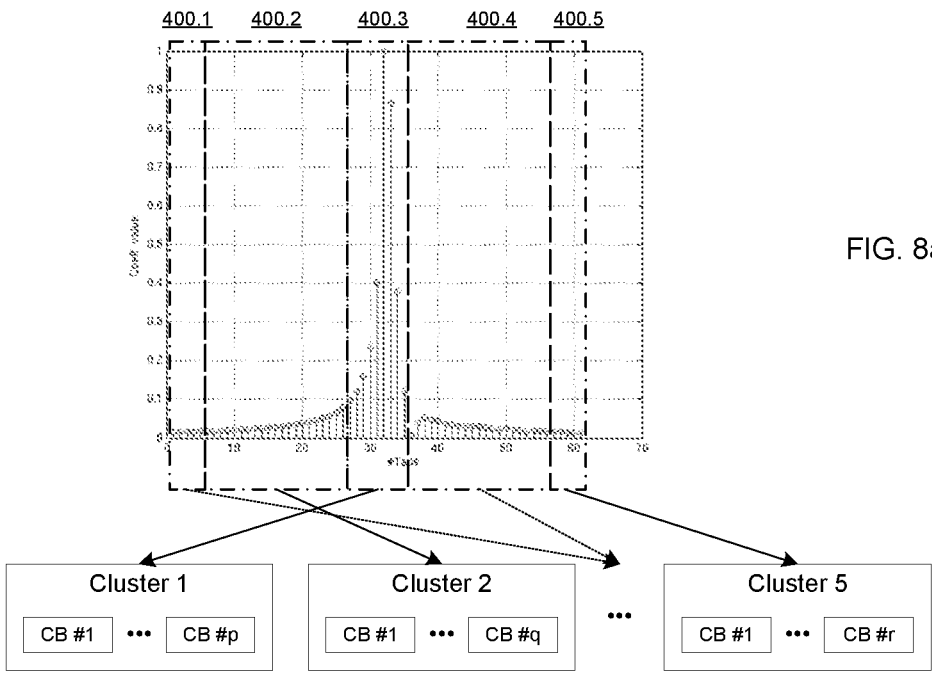
FIGS. 8a, 8b and 9 show filter coefficient diagrams illustrating allocation of the tapped delay signals $s(n-i)$ to different of signal sets $\{s(n-i)\}$ according to examples of the present invention.

As exemplified in the filter coefficient plot of FIG. 8a, the filter coefficients $c_i(n)$ comprise more and less dominant coefficients or filter coefficients $c_i(n)$ with higher and lower contribution. In the shown illustrative plot, the more dominant filter coefficients are located at the taps around tap number 30 (of 60 taps in total). The remaining filter coefficients may be considered as less dominant. It may be understood that the more dominant filter coefficients may have a lower convergence rate than the less dominant filter coefficient. It may be also understood that a shortened convergence of the more dominate filter coefficients improves the overall operation of the adaptive filter. Moreover, the contribution of the more dominant filter coefficients to the output signal $y(n)$ is more significant than the contribution of the less dominant filter coefficients to the output signal $y(n)$.

The controllable computational resource sharing enables to consider the above considerations in the operation of the adaptive filter while meeting performance requirements at a reduced power consumption.

The symbol routing logic 300 allows to partition the total number of L tapped delay signals $s(n-i)$ generated on each sampling cycle by the tapped-delay-line into w signal sets of tapped delay signals $\{s(n-i)\}.1$ to $\{s(n-i)\}.w$. Each signal set may comprise a different number of tapped delay signals $s(n-i)$. The total number of L tapped delay signals $s(n-i)$ are for instance partitioned into the five sets 400.1 to 400.5, each comprising a different number of successive tapped delay signals $\{s(n-i)\}$, where $i=, i_1, \ldots, i_2$, where $i_1$ and $i_2$ are integers, $i_1 < i_2$, $0 < i_1$, $i_2 < L-1$, and L is the order of the adaptive filter.

The total number of L tapped delay signals $s(n-i)$ may be partitioned into sets based on the monitored, assumed or expected contribution levels to the output signal $y(n)$. The total number of L tapped delay signals $s(n-i)$ may be partitioned into sets based on the monitored, assumed or expected value amounts of the associated filter coefficients $c_i(n)$. Initially a partitioning of the tapped delay signals $s(n-i)$ to signal sets may be predefined, for instance, the tapped delay signals $s(n-i)$ may be evenly assigned to signal sets having substantially the same number of tapped delay signals $s(n-i)$, e.g. when the initial values of the filter coefficients are set to zero. When initially starting the filter coefficient adjusting with initial non-zero values, the allocation of the tapped delay signals $s(n-i)$ to different signal sets may be based in the initial non-zero values, which may be considered to be indicative of levels of contribution or significance levels of the respective tapped delay signal $s(n-i)$. During operation of the adaptive filter, the total number of L tapped delay signals $s(n-i)$ may be repartitioned for instance in response to the monitored value amounts of the filter coefficients On).

As illustratively shown in FIG. 8a, the first signal set 400.1 and the last signal set 400.5 each comprise tapped delay signals $s(n-i)$ with the smallest amount of value of the associated filter coefficients $c_i(n)$. The third signal set 400.3 comprises tapped delay signals $s(n-i)$ with the highest amount of value of the associated filter coefficients $c_i(n)$. The second signal set 400.2 and the forth signal set 400.4 each comprise tapped delay signals $s(n-i)$ with the medium amount of value of the associated filter coefficients $c_i(n)$.

Each of the signal sets is associated to one of the clusters, herein five clusters according to the five signal sets. For instance, the cluster 1 is associated with the third signal set 400.3. Computational blocks are allocated to each one of the five clusters. The numbers of computational blocks allocated to the clusters may differ. However, as understood from the above discussion, the crucial factor, which defines the computational performance of a cluster, is given by the individual sharing factor $k_i$, wherein $i=1$ to w and w is the number of clusters. The sharing factor $k_i$ defines the ratio between the number of tapped delay signals and filter coefficients $c_i(n)$, respectively, assigned to a cluster i and the number of computational blocks allocated to the cluster i. The sharing factors $k_i$ of the different clusters may differ from each other.

The allocation of tapped delay signal $s(n-i)$ may be performed based on one or more threshold levels applied to the amount values of the filter coefficients $c_i(n)$ or the initial values of the filter coefficients $c_i(n)$. The allocation of the tapped delay signals to different sets values may be based on normalized values of the filter coefficients $c_i(n)$. Normalized values of the filter coefficients $c_i(n)$ may improve the comparableness. The allocation of the tapped delay signals $s(n-i)$ to the five signal sets exemplified in FIG. 8a may be the result of two threshold levels applied to the amount values of the filter coefficients $c_i(n)$. The amount values or normalized values of the filter coefficients $c_i(n)$ may be used for reallocation of the tapped delay signal $s(n-i)$ to the signal sets.

In an example of the present application, clusters, to which signal sets with less dominant filter coefficients $c_i(n)$ are assigned, may be operated with a higher sharing factor than clusters, to which signal sets with more dominant filter coefficients $c_i(n)$ are assigned.

The cluster controller block 320 is arranged to allocate the computational blocks to the clusters. Initially, the computational blocks may be allocated to clusters according to an initial allocation scheme; for instance, the computational blocks may be evenly allocated to clusters comprising substantially the same number of computational blocks. During operation of the adaptive filter, the allocation of the computational blocks may be adapted for instance in response to the monitored contribution levels and/or the state of convergence of the filter coefficients $c_i(n)$.

Figure 8B:
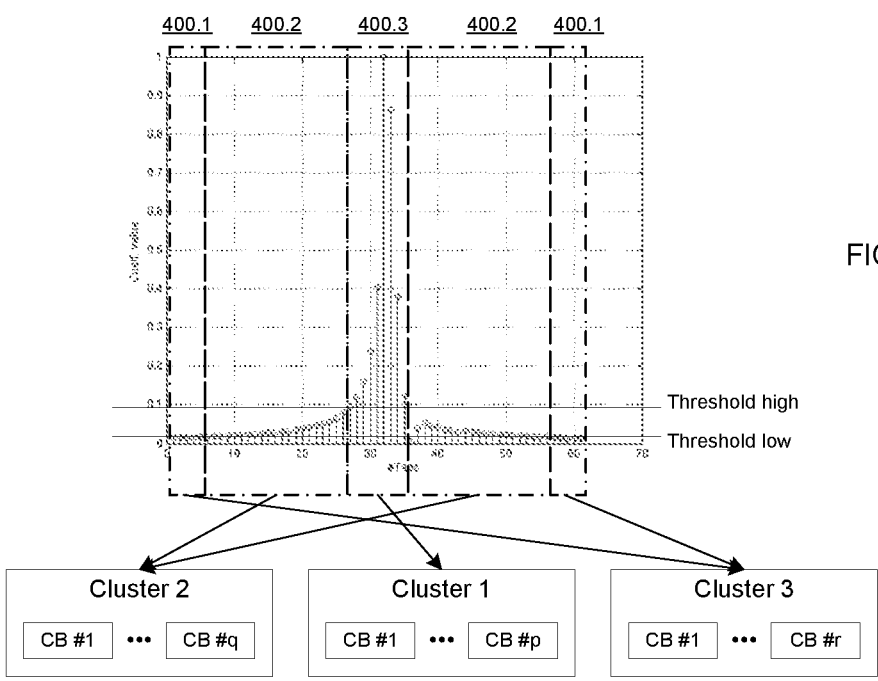

As further illustratively shown in FIG. 8b, the tapped delay signal $s(n-i)$ may allocated to three signal sets 400.1, 400.2 and 400.3 based on one two threshold levels (cf. threshold low and threshold high) applied to normalized values of the filter coefficients $c_i(n)$. A number of N thresholds defines a number of N+1 (sub-) ranges of (normalized) filter coefficient values or value subranges.

The tapped delay signs are allocated to one of the N+1 signal sets (corresponding to the number N+1 of value subranges) based on the allocation of the values of the respective filter coefficient $c_i(n)$ to the one of the N+1 value subranges. Accordingly, each signal sets may comprise one, two or more subsets of successive tapped delay signals $s(n-i)$. Herein, the signal sets 400.1 and 400.2 each comprise two continuous subsets of tapped delay signal $s(n-i)$ and the signal set 400.4 comprises one subsets of successive tapped delay signal $s(n-i)$. Each of the three signal sets 400.1 to 400.3 is assigned to one of three clusters.

The number of computational blocks allocated to each of the three cluster may be further selected based on the normalized values of the filter coefficients $c_i(n)$ in the respective signal set. In case the normalized values of the filter coefficients $c_i(n)$ of a signal set are low in comparison to the other ones, a low number of computational blocks is allocated to the respective cluster, which means that the filter coefficients $c_i(n)$ of the signal set with low values are adjusted using a high sharing factor k. In case the normalized values of the filter coefficients $c_i(n)$ of a signal set are high in comparison to the other ones, a high number of computational blocks is allocated to the respective cluster, which means that the filter coefficients $c_i(n)$ of the signal set with high values are adjusted using a low sharing factor k. In case the normalized values of the filter coefficients $c_i(n)$ of a signal set are medium in comparison to the other ones, a medium number of computational blocks is allocated to the respective cluster, which means that the filter coefficients $c_i(n)$ of the signal set with high values are adjusted using a medium sharing factor k.

Referring back to FIG. 8b, the cluster 1 may comprise a high number of computational blocks for adjusting the filter coefficients $c_i(n)$ corresponding to the tapped delay signals $s(n-i)$ of the signal set 400.3. The cluster 3 may comprise a low number of computational blocks for adjusting the filter coefficients $c_i(n)$ corresponding to the tapped delay signals $s(n-i)$ of the signal set 400.1. The signal set 400.1 comprises two subsets. The cluster 2 may comprise a medium number of computational blocks for adjusting the filter coefficients $c_i(n)$ corresponding to the tapped delay signals $s(n-i)$ of the signal set 400.2. The signal set 400.2 comprises two subsets.

Figure 9:
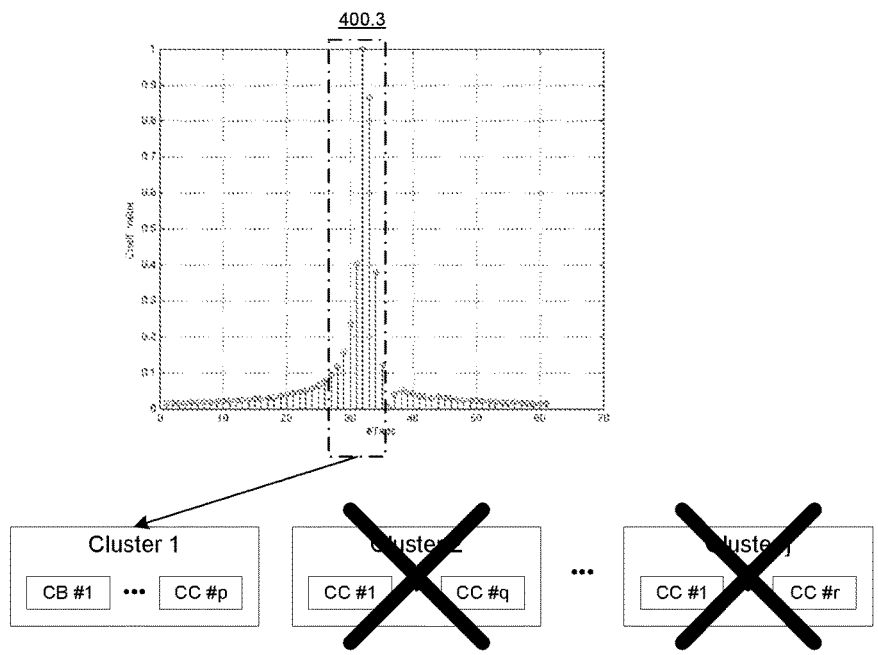

Further referring to FIG. 9, the operation of the computational blocks of one or more clusters may be disabled by the cluster controller block 320. The cluster controller block 320 is arranged to individually and/or cluster-wise enable or disable the operation of the computational blocks. A disabling of the computational blocks of one or more clusters may be performed in response to the monitoring block 200, which is arranged to monitor the development of the filter coefficients $c_i(n)$ over time. Based on the monitoring of the development of the filter coefficients $c_i(n)$, the monitoring block 200 is enabled to detect when filter coefficients $c_i(n)$ have reached the steady state.

For instance, in case the filter coefficients $c_i(n)$, which are assigned to one cluster for adjusting procedure has reached the steady state, the computational blocks of the cluster can be disabled at least temporarily to reduce the power consumption. In particular, the computational blocks of the cluster may be disabled for a predefined off-time interval Toff, after which the disabled computational blocks are put into operation again.

For the above-description, it is well understood that the suggested design of the adaptable filter with configurable computational resources sharing enables to flexibly and dynamically assign computational power for a configurable subset of tapped delay signals $s(n-i)$ and filter coefficients $c_i(n)$, respectively. Thereby, the available computational power of the computational blocks employed for performing the adjusting procedure according to an adaptive convergence algorithm is efficiently usable while the overall number of implemented computational blocks can be reduced to an economic number.

Although, the use of resource sharing and in particular manageable resource sharing can significantly improve the power and cost efficiency of adaptive filters, the convergence rate of the filter coefficients $c_i(n)$ my suffer. As schematically illustrated in and above described with reference to an adaptive filter as exemplarily shown in FIG. 5, the convergence time of a filter coefficient $c_i(n)$ increases when making use of computational resources sharing. The convergence time of a filter On) corresponds to the time period required by the adjusting procedure to yield to a value of the filter coefficient $c_i(n)$, which is substantially constant, which changes by small amounts only about its optimum convergence value, or which has reached steady state, in other words.

Figure 10A:
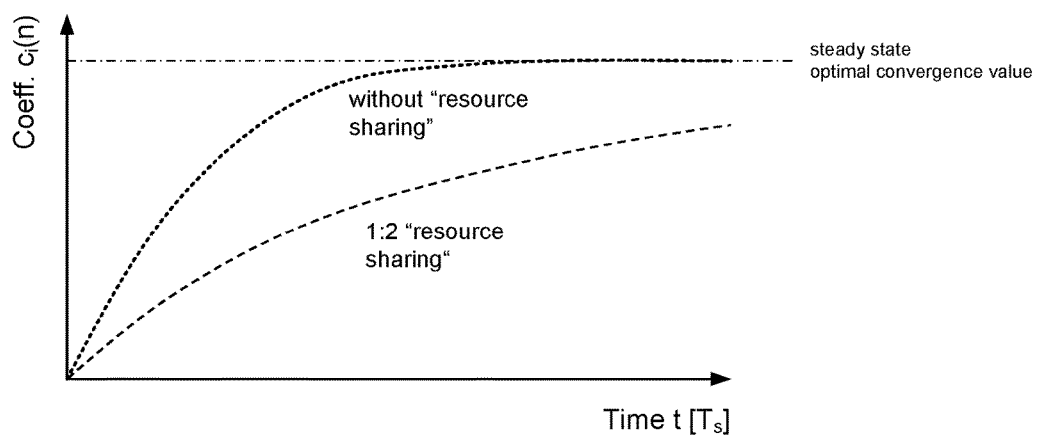
FIG. 10a schematically illustrates a diagram showing the development of filter coefficients over time according to an example of the present invention.
Figure 10B:
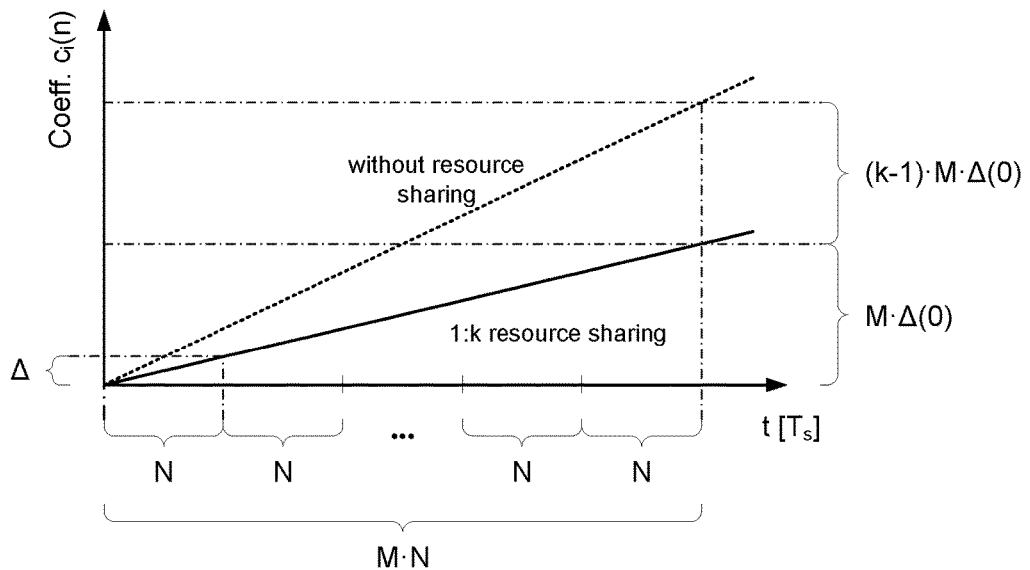
FIG. 10b schematically illustrates a further diagram showing the development of filter coefficients over time according to an example of the present invention.

The reduced rate of convergence is further illustrated with reference to FIGS. 10a and 10b, which schematically illustrate the development of a filter coefficient $c_i(n)$ updated over time in accordance with an adaptive convergence algorithm such as the aforementioned LMS algorithm either with or without using resource sharing. Only for the sake of explanation, a substantial linear development of a filter coefficient $c_i(n)$ is schematically illustrated. In general, the development of the filter coefficient $c_i(n)$ depends on the applied adaptive convergence algorithm. The parameter k indicates a factor relating to computational resource sharing. The parameter k corresponds to the above-described sharing factor k. When comparing the development of the filter coefficient $c_i(n)$ over time determined based on an adaptive convergence algorithm carried out on a convergence module without computational resource sharing, on the one hand, and carried out on a convergence module using computational resource sharing with a sharing factor k, on the other hand, the slopes of the curve defined by the development of the filter coefficient $c_i(n)$ over time are different. The slope of the curve determined using computational resource sharing is substantially reduced by the sharing factor k. Accordingly the convergence rate is significantly increased when using computational resource sharing.

In order to improve the convergence rate, an offset determined based on the monitored development of the filter coefficient $c_i(n)$. The determined offset is injected to the filter coefficient $c_i(n)$ at predefined periods of time. The injection of the determined offset is stopped in case the filter coefficient $c_i(n)$ varies about the convergence value, which is indicative of the filter coefficient $c_i(n)$ having reached the steady state.

The offset $Off_i$ is determined based on a value difference of the filter coefficient $c_i(n)$. The value difference $\Delta_i$ is determined over a period of time $N \cdot T_s$, where $T_s$ is the sampling time and fs is the sampling frequency of the adaptive filter ($Ts=1/f_s$) and N is an predetermined integer value, $N \geq 1$, wherein $$c'_i(n) \approx \frac{c_i(n) - c_i(n-N)}{N}$$
$$\Delta_i(n) = N \cdot c'_i(n) = c_i(n) - c_i(n-N)$$

The value difference $\Delta_i$ is determined with n=0, wherein n is a sampling index relating to the sampling time $T_s$. The sampling index n=0 is indicative of the start of the filter coefficient adjusting procedure.

The value difference $\Delta_i(n)$ is further determined each period of time $M \cdot N \cdot T_s$ after the potential injection of the offset $Off_i$. The value difference $\Delta_i^j(j)$ is hence determined at $n=j \cdot M \cdot N$, where $j=1, 2, 3 \ldots$ ($t=n \cdot T_s$). Accordingly, $$\Delta_i^j(j) = \Delta_i(j \cdot M \cdot N + N)$$
$$= N \cdot c'_i(j \cdot M \cdot N + N)$$
$$= c_i(j \cdot M \cdot N + N) - c_i(j \cdot M \cdot N)$$

At each period of time $M \cdot N \cdot T_s$, the offset $Off_i$ is added to the filter coefficient $c_i(n)$ provided that the current slope of the development of the filter coefficient $c_i(n)$ is below a predefined threshold. A current slope of the development of the filter coefficient $c_i(n)$ below the predefined threshold is considered to be indicative of a filter coefficient $c_i(n)$ slightly varying about the optimal convergence value.

The offset $Off_i(j)$ is determined based on the value difference $\Delta_i^j(j)$ and the sharing factor k:

$$Off_i(j) = (k-1) \cdot M \cdot \Delta_i^j(j)$$
$$= (k-1) \cdot M \cdot N \cdot c'_i(j \cdot M \cdot N + N)$$
$$= (k-1) \cdot M \cdot [c_i(j \cdot M \cdot N + N) - c_i(j \cdot M \cdot N)]$$

When using the above vector representation, the offset $Off_i(j)$ can be described as following:

$$C'(n) \approx \frac{C(n) - C(n-N)}{N}$$
$$\overline{\Delta}(n) = N \cdot C'(n) = C(n) - C(n-N)$$
$$\overline{Off}(j) = (k-1) \cdot M \cdot \overline{\Delta}(j \cdot M \cdot N + N)$$
$$= (k-1) \cdot M \cdot N \cdot C'(j \cdot M \cdot N + N)$$
$$= (k-1) \cdot M \cdot [C(j \cdot M \cdot N + N) - C(j \cdot M \cdot N)]$$

wherein $C'(n)=[c'_0(n), c'_1(n), \ldots, c'_{L-1}(n)]^T$, $\overline{\Delta}(n)=[\Delta_0(n), \Delta_1(n), \ldots, \Delta_{L-1}(n)]^T$, and $\overline{Off}(j)=[Off_0(j), Off_1(j), \ldots, Off_{L-1}(j)]^T$.

Hence, the offset can be written as following:

$$\overline{Off}(n) = \begin{cases} \overline{Off}\left(\frac{n}{M \cdot N} - 1\right) & \text{if } n \bmod (M \cdot N) = 0 \\ 0 & \text{otherwise} \end{cases}$$

and the injection can be written as following:

$$C(n) = C(n) + \overline{Off}(n)$$

Figure 10C:
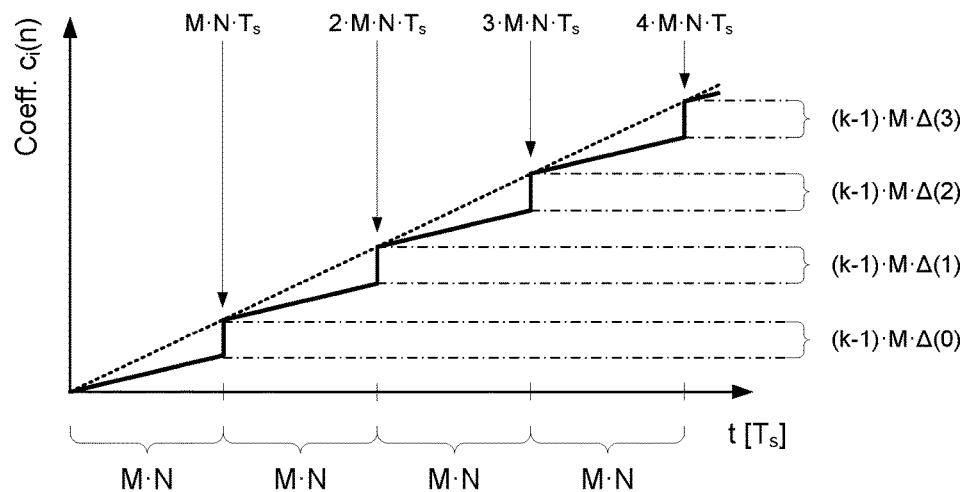
FIG. 10c schematically illustrates a diagram showing the development of a filter coefficient over time with offset injection according to an example of the present invention.

As schematically illustrated in FIG. 10c:

$t = 1 \cdot M \cdot N \cdot T_s$: $c_i(n) = c_i(n) + Off_i(0)$, wherein $n = 1 \cdot M \cdot N$ and $j = 0$;

$t = 2 \cdot M \cdot N \cdot T_s$: $c_i(n) = c_i(n) + Off_i(1)$, wherein $n = 2 \cdot M \cdot N$ and $j = 1$;

$t = 3 \cdot M \cdot N \cdot T_s$: $c_i(n) = c_i(n) + Off_i(2)$, wherein $n = 3 \cdot M \cdot N$ and $j = 2$;

$t = 4 \cdot M \cdot N \cdot T_s$: $c_i(n) = c_i(n) + Off_i(3)$, wherein $n = 4 \cdot M \cdot N$ and $j = 3$;

...

$t = (j+1) \cdot M \cdot N \cdot T_s$: $c_i(n) = c_i(n) + Off_i(j)$, wherein $n = (j+1) \cdot M \cdot N$; and further otherwise: $c_i(n+1) = c_i(n) + \mu \cdot e(n) \cdot s(n-i)$ The adaptive convergence algorithm is performed for at each cycle, whereas offsets are injected on a periodic basis having a period greater than the iteration cycle of the adaptive convergence algorithm.

It should be noted that current slopes of the development of the filter coefficient $c_i(n)$ at the above-mentioned points in time $(j+1) \cdot M \cdot N \cdot T_s$, $j=0, 1, 2 \ldots$ are positive such that the offset $Off_i(j)$ is added. Otherwise, if the slope is negative, the offset $Off_i(j)$ would be subtracted. As described below, the slope may be approximated by a difference quotient determined with respect to a predefined period of time, which may be shorted than the injection period.

Figure 10D:
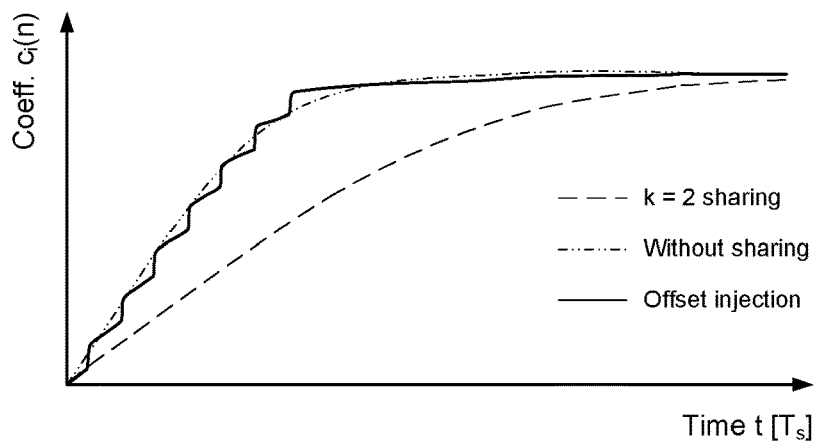
FIG. 10d illustrates a schematic diagram of an exemplary development of the value of a filter coefficient $c_i(n)$ over time.

FIG. 10d illustrates a schematic diagram of an exemplary development of the value of a filter coefficient $c_i(n)$ over time. Offsets are periodically injected until the value of the filter coefficient $c_i(n)$ has substantially (e.g. approximately) reaches its optimal convergence value. The diagram of FIG. 10d the development of the value of a filter coefficient $c_i(n)$ over time using an adaptive filter with computational resource sharing and offset injection (solid line); the development of the value of a filter coefficient $c_i(n)$ over time using an adaptive filter with computational resource sharing without offset injection (dash line); and the development of the value of a filter coefficient $c_i(n)$ over time using an adaptive filter without computational resource sharing (dash-dot-dot line).

The convergence rate of the adaptive filter with computational resource sharing and offset injection substantially corresponds to the convergence rate of the adaptive filter without computational resource sharing. The convergence rate of the adaptive filter with computational resource sharing (and without offset injection) is significantly lower.

Figure 11A:
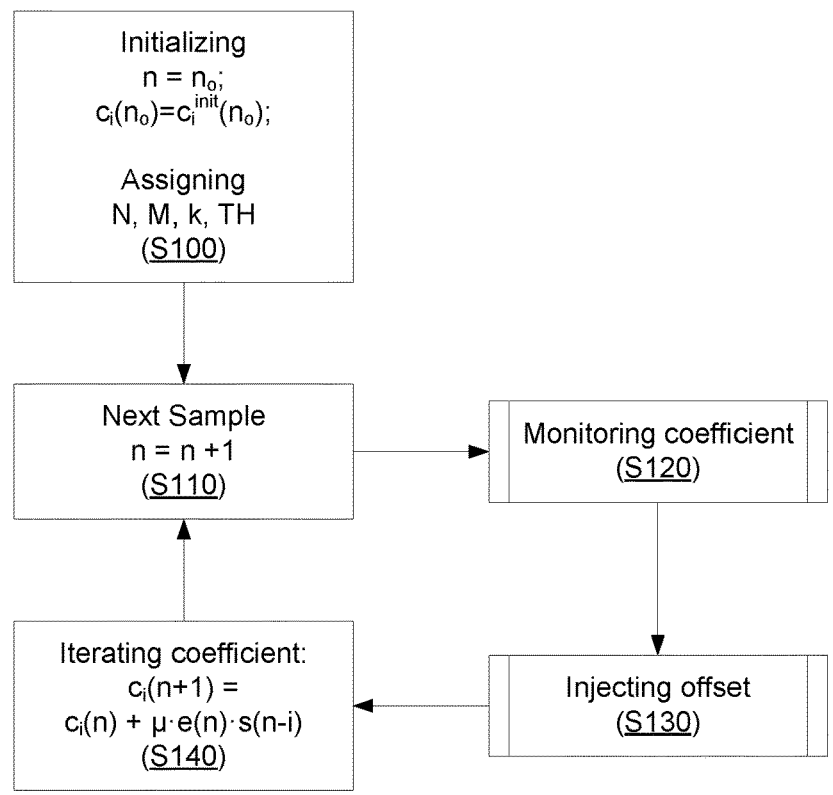
FIGS. 11a to 11d schematically illustrate flow diagrams of the method for injecting an offset according to examples of the present invention.

Referring now to FIG. 11a, a schematic flow diagram is illustrated showing an exemplary implementation of the method to improve the convergence rate of an adaptive filter with computational resource sharing. An example of an adaptive filter with computational resource sharing has been above discussed in more detail.

The improved convergence rate of a filter coefficient $c_i(n)$ is obtained by an offset value $Off_i(j)$, which is added or subtracted at a predetermined period of time. The adding or subtracting of the offset value $Off_i(j)$ depends on a current slope of the development of the filter coefficient $c_i(n)$, in particular the adding or subtracting depends on whether the slope is positive (raising filter coefficient) or negative (falling filter coefficient). The offset value $Off_i(j)$ is based on a periodically determined value difference $\Delta_i(j)$, wherein j is an index to the periods.

The method performs with respect to the sampling time $T_s$ and the sampling index n, respectively, wherein time $t=n \cdot T_s$ and $n=0, 1, 2 \ldots$ In an initial operation S100, the adaptive convergence algorithm is initialized and values are assigned for a first time period $T_1$ and a second time period $T_2$. Typically, the sample index n is set to $n=n_0$ and the initial value of the filter coefficient $c_i(n)$ is set to $c_i(n)=c_i^{init}(n)$. In an example, the sample index n is set to $n_0=0$. In an example, the initial value of the filter coefficient $c_i(n)$ is set to $c_i(n)=0$. The sharing factor k is predefined by the implementation of the adaptive filter with computational resources sharing. A threshold value TH is assigned, which allows to determine whether or not the filter coefficient $c_i(n)$ has reached the steady state.

The first time period $T_1$ is defined with respect to two parameter N and M, where N and M are integers and $N>1$, $M>1$. For instance, the first time period $T_1=N \cdot M \cdot T_s$. The second time period $T_2$ is defined with respect to the parameter N. For instance, the second time period $T_2=N \cdot T_s$. In an example, the parameter N is greater than the sharing factor k ($N>k$). The second time period $T_2$ occurs M times in the first time period $T_1$.

In an operation S100, the sample index is increased by one ($n=n+1$).

In an operation S120, the development of the filter coefficient $c_i(n)$ is monitored. The development is monitored on the basis of the change of the value of the filter coefficient $c_i(n)$ developing over time. For instance, a slope is determined from the value of the filter coefficient $c_i(n)$, in particular with respect to the second time period $T_2$.

In an operation S130, it is determined whether or not an offset is injected into the iteration of the filter coefficient $c_i(n)$. In particular, such offset is injected each first time period $T_1$, only. More particularly, the offset is only injected in case the filter coefficient $c_i(n)$ has not reached the steady state, e.g. in case an absolute value of the monitored slope exceeds the predefined threshold TH, which is considered as indicative of the filter coefficient $c_i(n)$ still significantly differing from the optimal convergence value. The offset to be injected is based on the monitored slope and further on the sharing factor.

In an operation S140, the iteration to calculate the filter coefficient $c_i(n)$ is performed. In accordance with the present example, the filter coefficient $c_i(n)$ is determined using the LMS algorithm:

$$c_i(n+1) = c_i(n) + \mu \cdot e(n) \cdot s(n-i)$$

The step size $\mu$ may be predefined in the initial operation. For the sake of completeness it should be noted that the step size $\mu$ may be a variable parameter dependent on the sampling index n: $\mu = \mu(n)$.

Figure 11B:
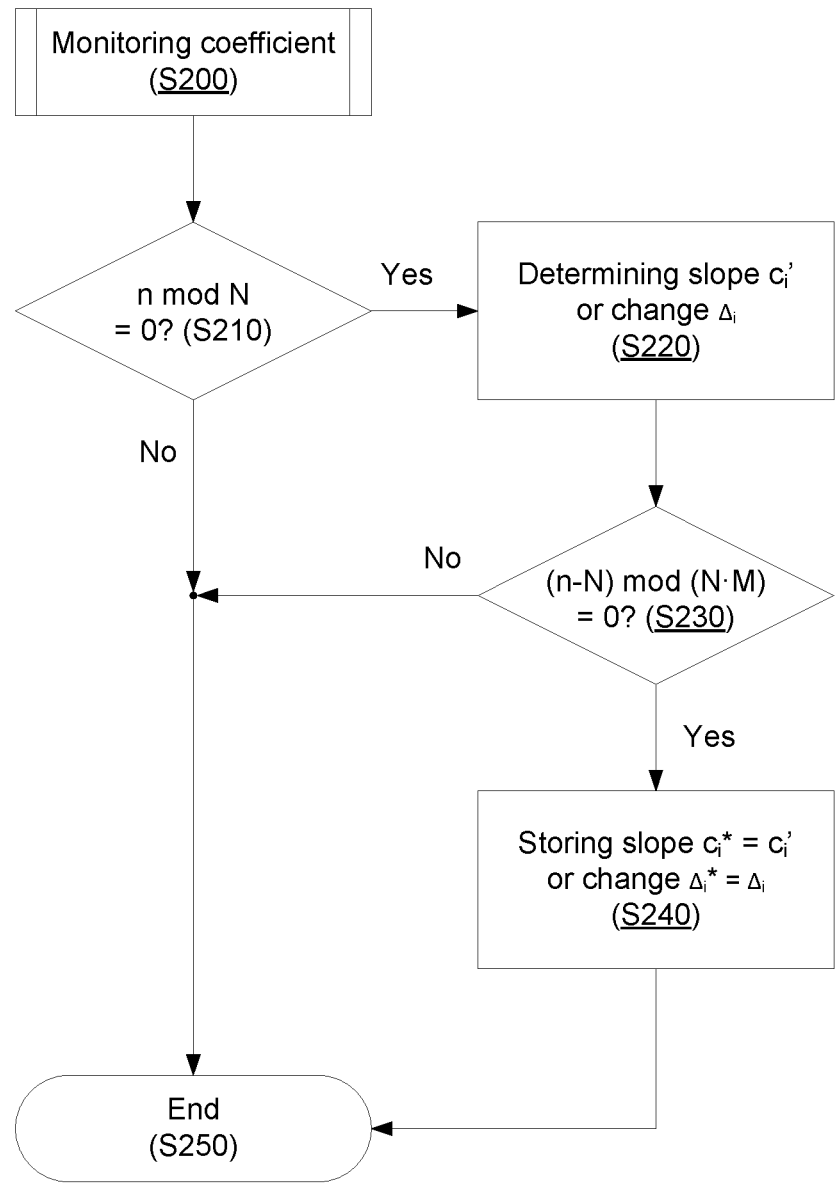

Referring now to FIG. 11b, a schematic flow diagram is illustrated showing an exemplary implementation of the monitoring of the development of the filter coefficient $c_i(n)$.

In an operation S200, the filter coefficient $c_i(n)$ is monitored based on the development of the value of the filter coefficient $c_i(n)$ within the first time period $T_1$. For instance, a slope or a value difference is determined at least at the beginning of each first time period $T_1$ and the ending of each first time period $T_1$. The slope or value difference is determined from the change of the values of the filter coefficient $c_i(n)$, e.g. over the second time period $T_2$.

In an operation S210, it is determined whether or not the second time period $T_2$ has lapsed. For instance, if the current sampling index n is a multiple of N and n is not zero ($n>0$) then the second time period $T_2$ has lapsed as indicated by following condition n mod N=0

In case the second time period $T_2$ has lapsed, a slope or value difference is determined in an operation S220. The slope is determined based on the change of the filter coefficient value $c_i(n)$ over time/sampling index. In an example, the slope $c_i'$ determined based on the values of the filter coefficient $c_i(n)$ and filter coefficient $c_i(n-N)$ at sampling index n and n-N:

$$c_i' \approx \frac{c_i(n) - c_i(n-N)}{N}$$

Alternatively, the value difference $\Delta_i$ may be determined, which should be considered as an equivalent value to the aforementioned slope:

$$\Delta_i = c_i(n) - c_i(n-N) = N \cdot c_i'(n)$$

In an operation S230, it is determined whether or not the determined slope $c_i'$ or change $\Delta_i$ relates to the beginning of the first time period $T_1$, for instance the first occurrence of the second time period $T_2$ in the first time period $T_1$:

$(n-N)$ mod $(N \cdot M) = 0$

If the determined slope or value difference relates to the beginning of the first time period $T_1$ then the slope $c_i'$ or change $\Delta_i$ may be stored in an operation S240 for later use. The stored slope $c_i^*$ or change $\Delta_i^*$ is used for determining the offset.

In an operation S250, the monitoring of the development of the filter coefficient $c_i(n)$ is completed.

Figure 11C:
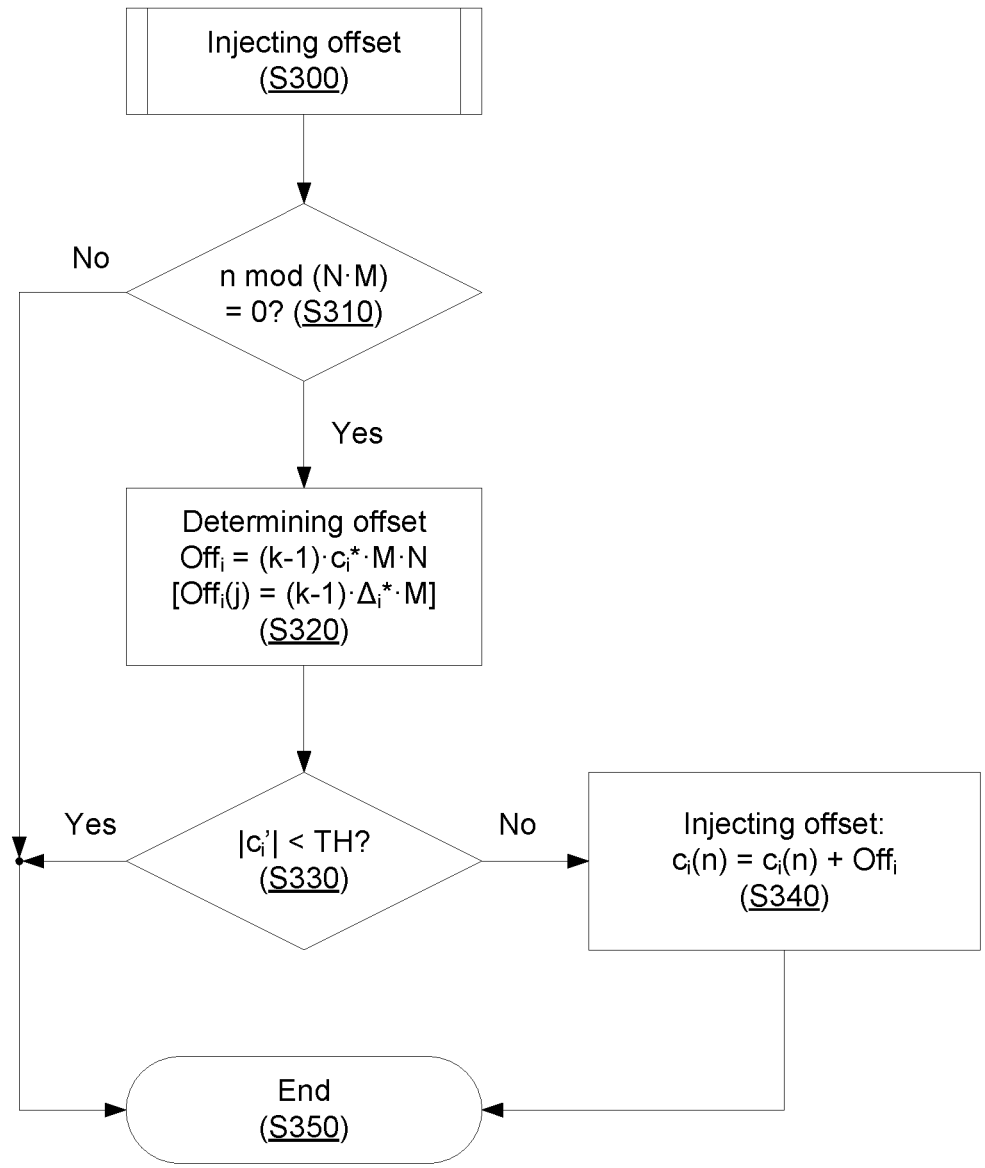

Referring now to FIG. 11c, a schematic flow diagram is illustrated showing an exemplary implementation of the injecting of an offset.

In an operation S300, injecting an offset into the iteration of the filter coefficient $c_i(n)$ is performed provided that the filter coefficient $c_i(n)$ has not reached steady state.

In an operation S310, it is determined whether or not the first time period $T_1$ has lapsed. For instance, if the current sampling index n is a multiple of $N \cdot M$ and n is not zero ($n>0$) then the first time period $T_1$ has lapsed as indicated by following condition n mod $(N \cdot M) = 0$ If the first time period Ti has lapsed, the offset $Off_i$ is determined in an operation S320. The offset $Off_i$ is based on the stored slope $c_i^*$ or change $\Delta_i^*$ to consider the development of the filter coefficient $c_i(n)$ over the first time period $T_1$. The offset $Off_i$ is further based on the sharing factor k, which enables to consider the reduced convergence rate because of the computational resources sharing of the adaptive filter. For instance, $$Off_i = (k-1) \cdot c_i^* \cdot M \cdot N; \text{ or}$$

$$Off_i = (k-1) \cdot \Delta_i^* \cdot M$$

As aforementioned, the offset $Off_i$ is injected into the iteration of the filter coefficient $c_i(n)$ if the filter coefficient $c_i(n)$ has not reached steady state.

In an operation S330, the current slope $c_i'$ or the current value difference $\Delta_i$ is compared against the predefined threshold TH. The current slope $c_i'$ is for instance determined from a difference quotient based on the filter coefficient $c_i(n)$ at different points in time, e.g. points in time n and (n−N). The current value difference $\Delta_i$ is for instance determined from a value difference based on the filter coefficient $c_i(n)$ at different points in time, e.g. points in time n and (n−N). In an example, the current slope $c_i'$ is the slope determined by the previous operation relating to the monitoring of the filter coefficient $c_i(n)$. In an example, the current value difference $\Delta_i$ is the value difference determined by the previous operation relating to the monitoring of the filter coefficient $c_i(n)$.

$$|c_i'| < TH_c; \text{ or}$$

$$|\Delta_i| < TH_\Delta$$

wherein $TH_\Delta \approx TH_c \cdot N$ in the present example.

If an absolute value of the current slope $c_i'$ or the current value difference $\Delta_i$ is less (or equal to) than the predefined threshold ($TH_c$ and $TH_\Delta$, respectively), it is assumed that the filter coefficient $c_i(n)$ has reached the steady state and only slightly varies about the optimal convergence value. In this case, the offset $Off_i$ is not injected.

Otherwise, if the absolute value of the current slope $c_i'$ or the current value difference $\Delta_i$ is greater than the predefined threshold, the offset $Off_i$ is injected into the iteration calculation of the filter coefficient $c_i(n)$ in an operation S340; for instance:

$$c_i(n) = c_i(n) + Off_i$$

In an operation S350, the injecting of an offset is completed.

Figure 11D:
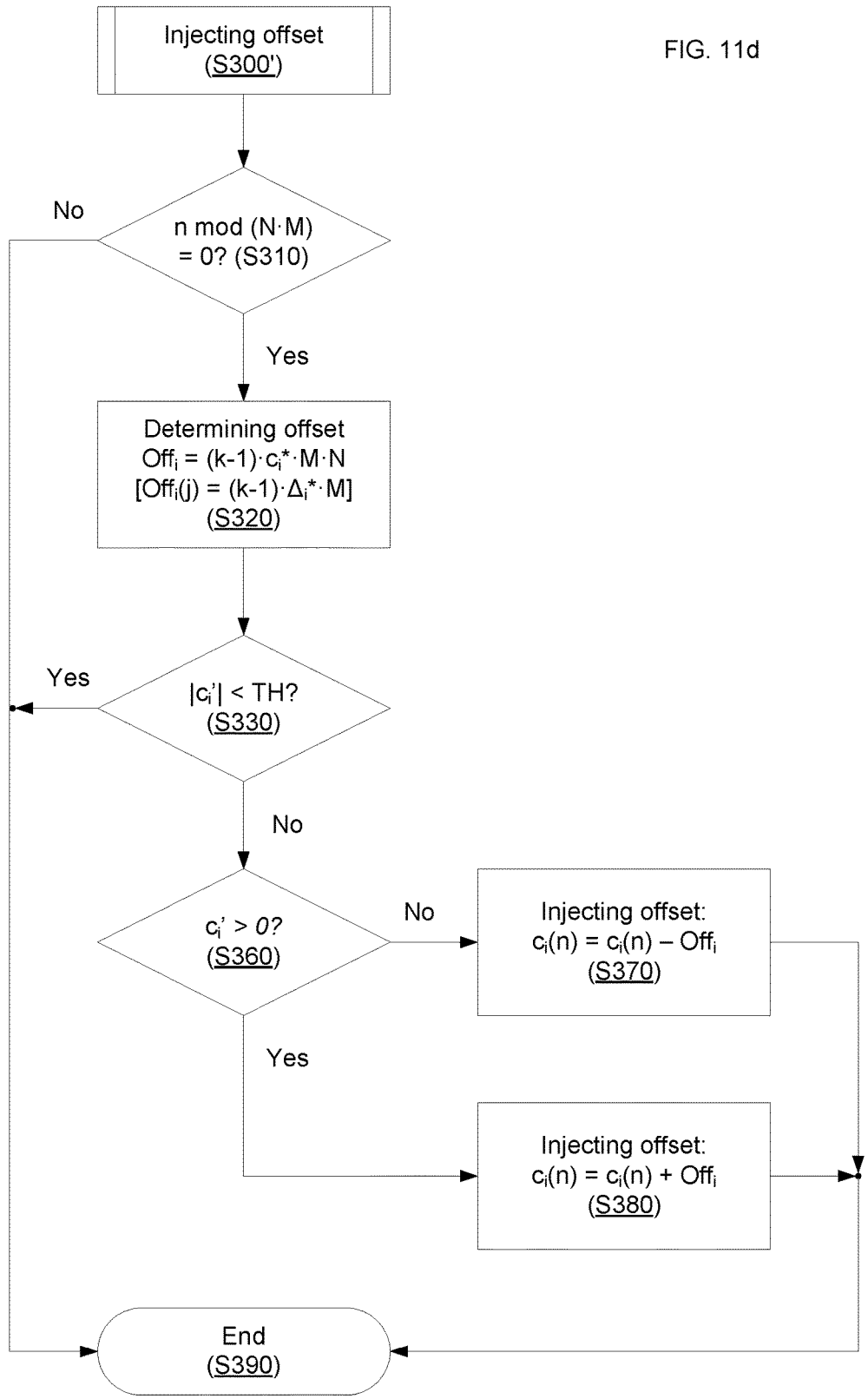

Referring now to FIG. 11d, a schematic flow diagram is illustrated showing a further exemplary implementation of the injecting of an offset.

In an operation S300', injecting an offset into the iteration of the filter coefficient $c_i(n)$ is performed provided that the filter coefficient $c_i(n)$ has not reached steady state.

In an operation S310, it is determined whether or not the first time period $T_1$ has lapsed. If the first time period $T_1$ has lapsed, the offset $Off_i$ is determined in an operation S320.

In an operation S330, the current slope $c_i'$ or the current change $\Delta_i$ is compared against the predefined threshold TH ($TH_c$ and $TH_\Delta$, respectively).

If an absolute value of the current slope $c_i'$ or the current value difference $\Delta_i$ is less (or equal to) than the predefined threshold, it is assumed that the filter coefficient $c_i(n)$ has reached the steady state and only slightly varies about the optimal convergence value. In this case, the offset $Off_i$ is not injected.

Otherwise, if the absolute value of the current slope $c_i'$ or the current value difference $\Delta_i$ is greater than the predefined threshold, the offset $Off_i$ is injected into the iteration calculation of the filter coefficient $c_i(n)$.

The operations S310 to S330 correspond to the respective operations described above with reference to FIG. 11c. An unnecessary repetition is omitted.

In an operation S340, it is determined whether the development of the filter coefficient $c_i(n)$ over time shows an ascending or descending behavior. Whether the filter coefficient $c_i(n)$ ascends or descends over time can be determined from the current slope $c_i'$ or the current value difference $\Delta_i$. If the current slope $c_i'$ or the current change $\Delta_i$ is greater than 0, the filter coefficient $c_i(n)$ ascends over time, otherwise if the current slope $c_i'(n)$ or the current change $\Delta_i$ is less than 0, the filter coefficient $c_i(n)$ descends over time:

$$c_i', \Delta_i > 0: \text{ ascending or } c_i', \Delta_i < 0: \text{ descending}.$$

If the filter coefficient $c_i(n)$ ascends over time, the offset $Off_i$ is added in an operation S370:

$$c_i(n) = c_i(n) + Off_i$$

If the filter coefficient $c_i(n)$ descends over time, the offset $Off_i$ is subtracted in an operation S380:

$$c_i(n) = c_i(n) - Off_i$$

In an operation S90, the injecting of an offset is completed.

Figure 12:
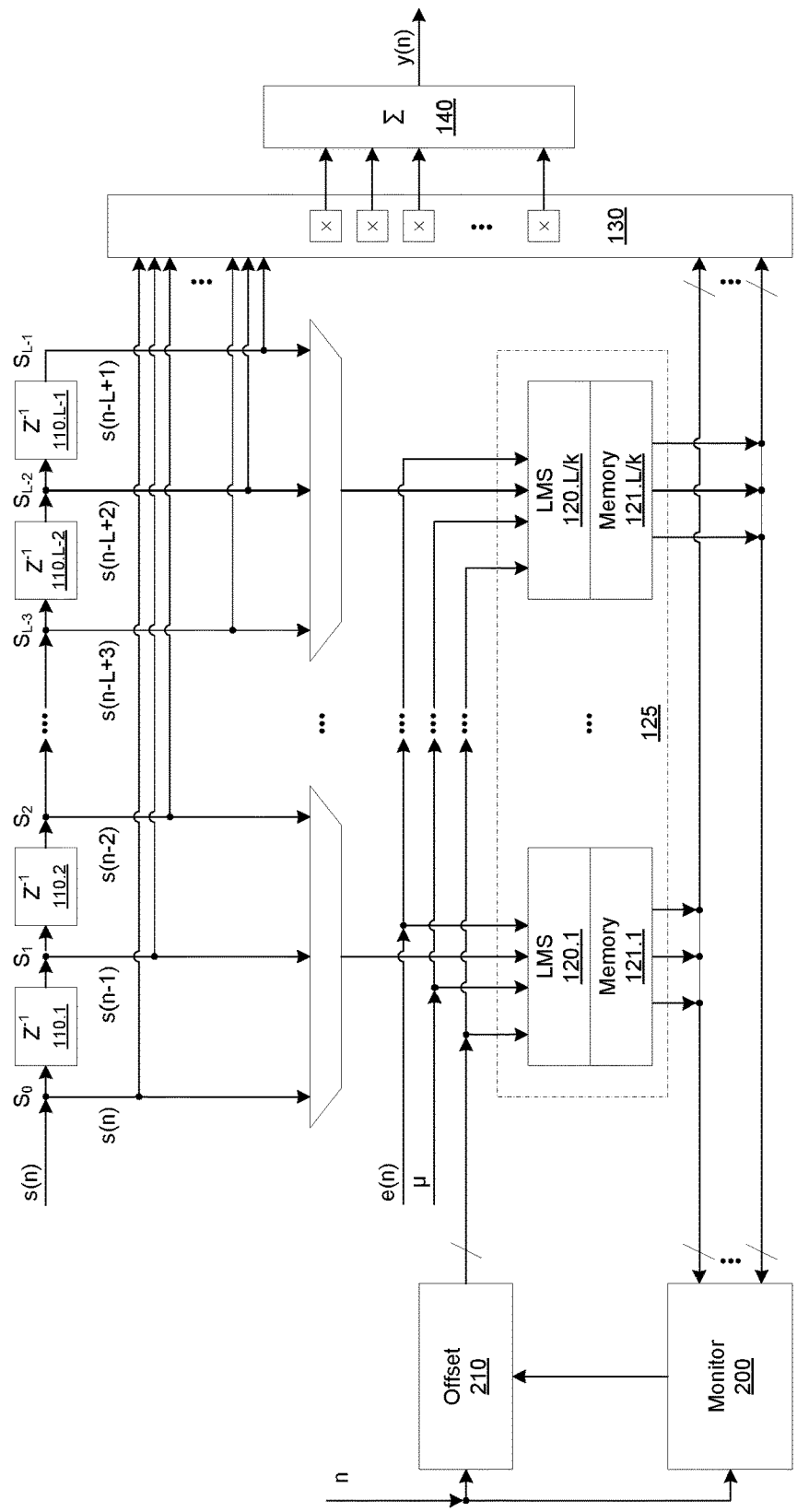
FIG. 12 schematically illustrates a block diagram of an exemplary adaptive filter using computational resources sharing and offset injection according to an example of the present invention.

Referring now to FIG. 12, a block diagram of another exemplary adaptive filter according to an embodiment of the present application is schematically illustrated. The adaptive filter shown in FIG. 12 has a filter order L and makes use of computational resource sharing in order to reduce the implementation complexity and costs.

According to the filter order L, the tapped-delay-line has L−1 delay elements 110.1 to 110.L−1 and provides L tapped delay signal s(n−i), i=0, . . . , L−1.

The exemplified adaptive filter of FIG. 12 has a sharing factor k=3. This means that one computational blocks is provided for three filter coefficients $c_i(n)$ each. Accordingly, the exemplified adaptive filter comprises L/k computational blocks 120.1 to 120.L/k. At each cycle, a subset of L/k filter coefficients are adjusted.

The LMS computational block 120.1 is for instance used to adjust the filter coefficients $c_0(n)$ to $c_2(n)$ and the LMS computational block 120.L/k is for instance used to adjust the filter coefficients $c_{L-3}(n)$ to $c_{L-1}(n)$ Those skilled in the art will understand that the computational resources sharing exemplary adaptive filter of FIG. 12 is only one illustrative example of a computational resources sharing adaptive filter and the present application is not intended to be limited thereto.

The adaptive filter further comprises L multipliers 130 for multiplying each tapped delay signal s(n−i) with the respective filter coefficient $c_i(n)$, where i=0 to L−1, and L−1 adders 140 for adding the weighted output signal contributions $Y_i(n)$ to obtain the output signal y(n). The adaptive filter further comprises at least L memory locations to store the L filter coefficients $c_i(n)$.

The adaptive filter further comprises a monitoring block 200, which has access to the filter coefficients $c_i(n)$ and which is arranged to monitor the development of the filter coefficients $c_i(n)$. In particular, the monitoring block 200 is configured to carry out the method of monitoring in particular as described above with reference to the flow diagrams shown in FIGS. 11a and 11b.

The adaptive filter further comprises a offset calculation block 210, which receives information from the monitoring block 200 about the development of the values of the filter coefficients $c_i(n)$ and is arranged to compute offsets values $\text{Off}_i$ for the filter coefficients $c_i(n)$ on a periodic time scale and inject the computed offsets $\text{Off}_i$ into the adjusting procedure of the filter coefficients $c_i(n)$. In particular, the offset computation block 210 is configured to carry out the method of monitoring in particular as described above with reference to the flow diagrams shown in FIGS. 11a, 11c and 11d.

It should be noted that the offset injection should not be understood to be limited to the LMS (least mean square) algorithm for adjusting the filter coefficient, with regard to which the methodology to improve the convergence rate has been illustratively explained above. The LMS algorithm is but one of an entire family of algorithms, which are based on approximations to steepest descent procedures. The family of algorithms further comprises for instance the sign-error algorithm, the sign-delta algorithm, sign-sign algorithm, zero-forcing algorithm and power-to-two quantized algorithm. The steepest descent procedures are based on the mean-squared error (MSE) cost function, which has been shown as useful for adaptive FIR filters. However, further algorithm are known, which are based on non-MSE criteria. The illustrated offset injection is in principle applicable with iteratively determined filter coefficients in the above-mentioned general form:

$$C(n)=C(n)+\overline{\text{Off}}(n)$$

$$C(n+1)=C(n)+\mu(n) \cdot G(e(n), S(n), \Phi(n))$$

Although the technique of offset injection has been described above with reference to an adaptive filter with fixed resource sharing, it is immediately understood by those skilled in the art for this disclosure that aforementioned offset injection technique is likewise applicable with the adaptive filter with configurable computational resources sharing described with reference to FIGS. 7 to 9. In particular, the offset injection is operative with each cluster 250.1 to 250.w having an individual sharing factor $k_j$, j=1, . . . , w. The offset to be injected is hence determined on the basis of the development of the individual filter coefficient $c_i(n)$ and the sharing factor $k_j$ of the one cluster 250.j, at which the convergence procedure for the individual filter coefficient $c_i(n)$ is performed. The offset calculation block 210 may be arranged with the monitoring block 200 and the filter coefficient memory 270. The monitoring block 200 further is configured as described above to enable the offset calculation block 210 to determine offsets $\text{Off}_i$ for the filter coefficient $c_i(n)$. The calculated offsets $\text{Off}_i$ may be periodically injected the adaptive convergence algorithm via access to the filter coefficient memory 270. The sharing factor $k_j$ may be determined from information supplied by the routing controller block 310 and the cluster controller block 320. The information is for instance indicative of the number of tapped delay signals in each of the signal sets $\{s(n-i)\}$ and the number of computational blocks 260 in each cluster 250.1 to 250.w, respectively.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To illustrate clearly this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

LIST OF REFERENCE SIGNS

100: adaptive filter;
110: delay element $Z^{-1}$;
110.1: delay element $Z^{-1}$;
110.5: delay element $Z^{-1}$;
110.L−1: delay element $Z^{-1}$;
120: computational block/LMS computational block;
120.0: computational block;
120.1: computational block;
120.3: computational block;
120.5: computational block;
120.L−1: computational block;
125: coefficient-adjusting module;
130: multiplier;
130.0: multiplier;
130.L−1: multiplier;
140: adder;
140.2: adder;
140.L: adder;
200: monitoring block;
210: offset calculation block;
230: cluster controller;
250: cluster/cluster of computational blocks;
250.1: cluster/cluster of computational blocks;
250.2: cluster/cluster of computational blocks;
250.j: cluster/cluster of computational blocks;
250.w: cluster/cluster of computational blocks;
260: computational block;
260.1: computational block;
260.2: computational block;
260.j: computational block;
260.w: computational block;
260.1.1: computational block (of cluster 250.1);
260.1.C1: computational block (of cluster 250.1);
260.2.1: computational block (of cluster 250.2);
260.2.C2: computational block (of cluster 250.2);
260.w.1 computational block (of cluster 250.w);
260.w.Cw computational block (of cluster 250.w);
270: memory storage/filter coefficients memory;
300: routing logic/symbol routing logic;
310: routing controller/routing controller block;
320: cluster controller/cluster controller block;
400: signal set/set of tapped delay signals;
400.1: signal set/set of tapped delay signals;
400.2: signal set/set of tapped delay signals;
400.3: signal set/set of tapped delay signals;
400.4: signal set/set of tapped delay signals;
400.5: signal set/set of tapped delay signals.

The invention claimed is:

1. An adaptive filter using resource sharing, said adaptive filter comprising:
   a tapped-delay-line providing L tapped delay signals, wherein L is a filter order of the adaptive filter, wherein L is a number;
   a number of computational blocks each configured for adjusting one filter coefficient, in one cycle of an iterative procedure according to an adaptive convergence algorithm, wherein the number of computational blocks is less than the filter order L;
   a cluster controller configured for allocating each of the computational blocks to one of a number of w clusters, wherein w is a positive integer; and
   a symbol routing logic arranged for routing a set of tapped delay signals, to each cluster,
   wherein the computational blocks of each cluster are provided for adjusting the filter coefficients, associated with the set of tapped delay signals, routed to the respective one of the clusters,
   wherein the computational blocks of each cluster are timely shared among the filter coefficients, of one set of tapped delay signals;
   and
   a routing controller provided for configuring the routing of the tapped delay signals to the respective cluster in accordance with the allocation thereof.

2. The adaptive filter of claim 1, further comprising:
   a monitoring block configured to monitor developments of the filter coefficient, over time.

3. The adaptive filter of claim 1,
   wherein the cluster controller is configured to dynamically reallocate the computational blocks to a respective one of the clusters.

4. The adaptive filter of claim 3,
   wherein the cluster controller is configured to reallocate the computational blocks to one of the clusters in response to information relating to the developments of the filter coefficient, generated by the routing controller.

5. The adaptive filter of claim 1,
   wherein the cluster controller is configured to disable computational blocks in response to information relating to the developments of the filter coefficient, generated by the routing controller.

6. The adaptive filter of claim 1,
   wherein the cluster controller is configured to selectively disable the computational blocks allocated to one of the clusters in response to information relating to the developments of the filter coefficient, generated by the routing controller.

7. The adaptive filter of claim 1,
   wherein the routing controller is adapted to dynamically route each one of the tapped delay signals, to one of the clusters.

8. The adaptive filter of claim 1,
   wherein each set of tapped delay signals, comprises one or more subsets of successive tapped delay signals, wherein $i = i_1, \ldots i_2$, wherein $i_1$ and $i_2$ are positive integers, $i_2 > i_1$.

9. The adaptive filter of claim 1,
   wherein the monitoring block is configured to detect whether or not a filter coefficient, has reached the steady state;

wherein the cluster controller is configured to disable the computational blocks allocated to one of the clusters in response to the monitoring block detecting that the filter coefficient, associated with the set of tapped delay signals, routed to the one cluster have reached the steady state.

10. The adaptive filter of claim 1, wherein the cluster controller is configured to disable the computational blocks of at least one of the cluster for a predefined off-time period, $T_{off}$.

11. The adaptive filter of claim 1, wherein the monitoring block is configured to detect contribution levels of the filter coefficients, wherein more dominant filter coefficients, have a higher level of contribution to an output signal, of the adaptive filter than less dominant filter coefficients, wherein the cluster controller is configured to allocate the numbers of computational blocks to the clusters depending on the detected contribution levels of the filter coefficients, wherein the routing controller is configured to individually allocate a number of tapped delay signals in each set of tapped delay signals, routed by the symbol routing logic to the respective cluster depending on the detected contribution levels of the filter coefficients associated with the respective set of tapped delay signals.

12. A method of operating an adaptive filter using resource sharing, wherein said adaptive filter comprises a tapped-delay-line providing L tapped delay signals, wherein L is a filter order of the adaptive filter, wherein L is a number, and a number of computational blocks each configured for adjusting one filter coefficient, in one cycle of an iterative procedure according to an adaptive convergence algorithm, wherein the number of computational blocks s less than the filter order;

said method comprising:

allocating each of a plurality of computational blocks to one of a number of w clusters, wherein w is a positive integer;

allocating the tapped delay signals, to a number of w sets, wherein the number of w clusters corresponds to the number of w sets of the tapped delay signals; and routing each tapped delay signals of the sets, to one respective one of the clusters, wherein the computational blocks of each cluster are timely shared among the filter coefficients, associated with the tapped delay signals, of the respective set, routed thereto.

13. The method of claim 12, wherein the tapped delay signals, are allocated to a respective one of the sets, based on the value of the filter coefficients, associated with the tapped delay signals.

14. The method of claim 12, further comprising:

monitoring development of the filter coefficients, over time.

* * * * *